US 7,885,098 B2
Feb. 8, 2011

(12) United States Patent
Ro et al.

(10) Patent No.: US 7,885,098 B2
(45) Date of Patent: *Feb. 8, 2011

(54) NON-VOLATILE PHASE-CHANGE MEMORY DEVICE AND METHOD OF READING THE SAME

(75) Inventors: Yu-Hwan Ro, Seoul (KR); Woo-Yeong Cho, Suwon-si (KR); Byung-Gil Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/316,017

(22) Filed: Dec. 23, 2005

(65) Prior Publication Data

US 2007/0103972 A1    May 10, 2007

(30) Foreign Application Priority Data

Nov. 7, 2005    (KR) ...................... 10-2005-0105964

(51) Int. Cl.
    *G11C 11/00*    (2006.01)

(52) U.S. Cl. ...................................... 365/163; 365/203

(58) Field of Classification Search ................. 365/163, 365/203, 189.06

See application file for complete search history.

(56) References Cited

U.S. PATENT DOCUMENTS

| | | | |
|---|---|---|---|
| 5,047,972 A * | 9/1991 | Wada .......................... | 708/319 |
| 5,255,232 A | 10/1993 | Foss et al. | |
| 6,314,014 B1 | 11/2001 | Lowrey et al. | |
| 6,324,111 B1 | 11/2001 | Sato et al. | |
| 6,952,129 B2 * | 10/2005 | Lin et al. ..................... | 327/536 |
| 6,963,506 B1 * | 11/2005 | Wang et al. ............. | 365/185.21 |
| 7,009,878 B2 * | 3/2006 | Hosono et al. ......... | 365/185.03 |
| 7,016,230 B2 * | 3/2006 | Hosono .................. | 365/185.17 |
| 7,050,328 B2 * | 5/2006 | Khouri et al. ................ | 365/163 |
| 7,391,644 B2 * | 6/2008 | Cho et al. .................... | 365/163 |

(Continued)

FOREIGN PATENT DOCUMENTS

JP    2001-035164    2/2001

(Continued)

*Primary Examiner*—Anh Phung
*Assistant Examiner*—Douglas King
(74) *Attorney, Agent, or Firm*—Volentine & Whitt, PLLC (57) ABSTRACT

In one aspect, a non-volatile semiconductor memory device includes a phase phase-change memory cell array including a plurality of word lines, a plurality of bit lines, and a plurality of phase-change memory cells, where each the phase-change memory cells includes a phase-change resistive element and a diode connected in series between a word line and a bit line among the plurality of word lines and bit lines of the phase-change memory cell array. The memory device of this aspect further includes a sense node which is selectively connected to a bit line of the phase-change memory cell array, a boosting circuit which generates a boosted voltage which is greater than an internal power supply voltage, a pre-charge and biasing circuit which is driven by the boosted voltage to pre-charge and bias the sense node, and a sense amplifier connected to the sense node. The boosted voltage may be equal to or greater than a sum of the internal power supply voltage and a threshold voltage of the diode of each phase-change memory cell.

36 Claims, 8 Drawing Sheets

U.S. PATENT DOCUMENTS

| | | |
|---|---|---|
| 2003/0169625 A1 | 9/2003 | Hush et al. |
| 2005/0018493 A1 | 1/2005 | Casper et al. |
| 2005/0030814 A1* | 2/2005 | Oh et al. .................... 365/222 |
| 2006/0221678 A1* | 10/2006 | Bedeschi et al. ............ 365/163 |
| 2006/0221734 A1* | 10/2006 | Bedeschi et al. ............ 365/201 |

FOREIGN PATENT DOCUMENTS

| | | |
|---|---|---|
| JP | 2005-158199 | 6/2005 |
| JP | 2005-251381 | 9/2005 |
| KR | 1020010029725 A | 4/2001 |
| KR | 2005-29013 | 3/2005 |
| KR | 10-2005-0052375 | 6/2005 |

* cited by examiner

FIG. 11

NON-VOLATILE PHASE-CHANGE MEMORY DEVICE AND METHOD OF READING THE SAME

BACKGROUND OF THE INVENTION

1. Field of the Invention

The present invention generally relates to non-volatile semiconductor memory devices, and more particularly, the present invention relates to non-volatile semiconductor memory devices which include phase-change memory cells.

A claim of priority is made to Korean Patent Application No. 10-2005-0105964, filed Nov. 7, 2005, in the Korean Intellectual Property Office, the entirety of which is incorporated herein by reference.

2. Description of the Related Art

A phase-change random access memory (PRAM), also known as an Ovonic Unified Memory (OUM), includes a phase-change material such as a chalcogenide alloy which is responsive to energy (e.g., thermal energy) so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

Figure 1A:
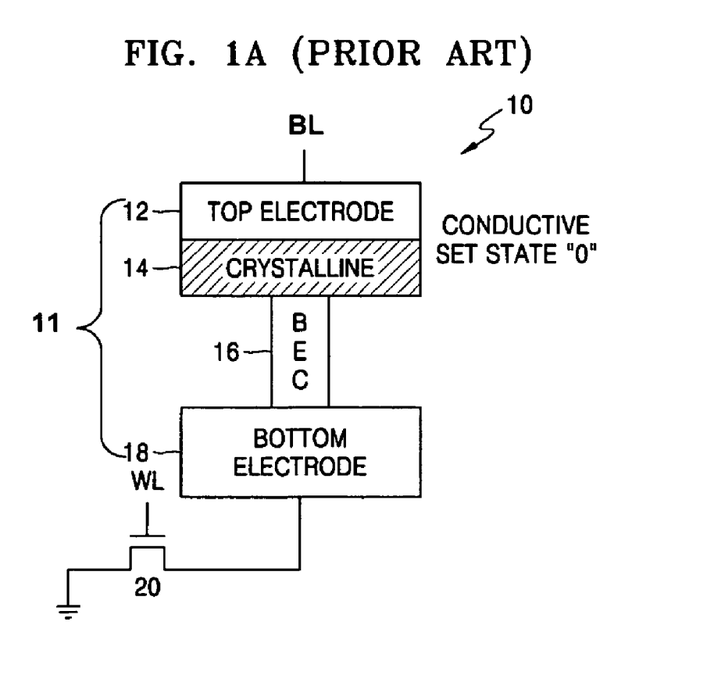
FIGS. 1A and 1B are schematic views of a phase-change memory cell in a set state and a reset state, respectively.
Figure 1B:
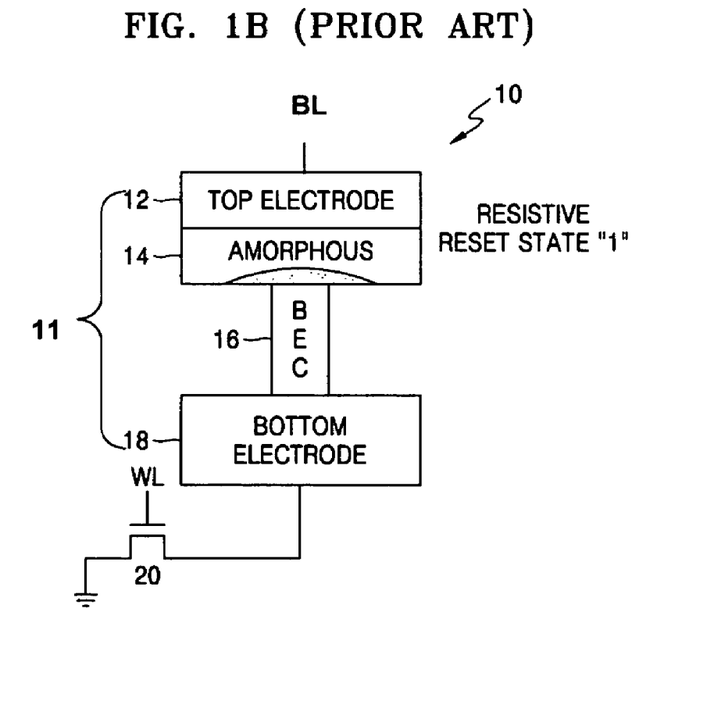

FIGS. 1A and 1B illustrate a memory cell 10 in a 'set' state and in a 'reset' state, respectively. In this example, the memory cell 10 includes a phase-change resistive element 11 and a transistor 20 connected in series between a bit line BL and a reference potential (e.g., ground), with the transistor 20 being gated to a word line WL. It should be noted that FIGS. 1A and 1B are general schematic views only, that the configuration of the phase-change resistive element 11 is presented as an example only, and that other configurations and connections with respect to the phase-change resistive element 11 are possible. As an example of one variation, the phase-change resistive element 11 may instead be connected in series with a diode between the bit line BL and the word line WL.

In each of FIGS. 1A and 1B, the phase-change resistive element 11 includes a top electrode 12 formed on a phase-change material 14. In this example, the top electrode 12 is electrically connected to a bit line BL of a PRAM memory array (not shown). A conductive bottom electrode contact (BEC) 16 is formed between the phase-change material 14 and a conductive bottom electrode 18. The access transistor 20 is electrically connected between the bottom electrode 18 and the reference potential. As already suggested, the gate of the access transistor 20 is electrically connected to the word line WL of the PRAM cell array (not shown).

In FIG. 1A, the phase-change material 14 is illustrated as being in its crystalline state. As described previously, this means that the memory cell 10 is in a low-resistance 'set' state or logic 0 state. In FIG. 1B, a portion of the phase-change material 14 is illustrated as being amorphous. Again, this means that the memory cell 10 is in a high-resistance 'reset' state or logic 1 state.

The set and reset states of the memory cell 10 of FIGS. 1A and 1B are established by controlling the magnitude and duration of current flow through the BEC 16. That is, the phase-change resistive element 11 is activated (or accessed) by operation of the access transistor 20 which is responsive to a voltage of the word line WL. When activated, the memory cell 10 is programmed according to the voltage of the bit line BL. The bit line BL voltage is controlled to establish a programming current ICELL which causes the BEC 16 to act as a resistive heater which selectively programs the phase-change material 14 in its 'set' and 'reset' states.

Figure 2:
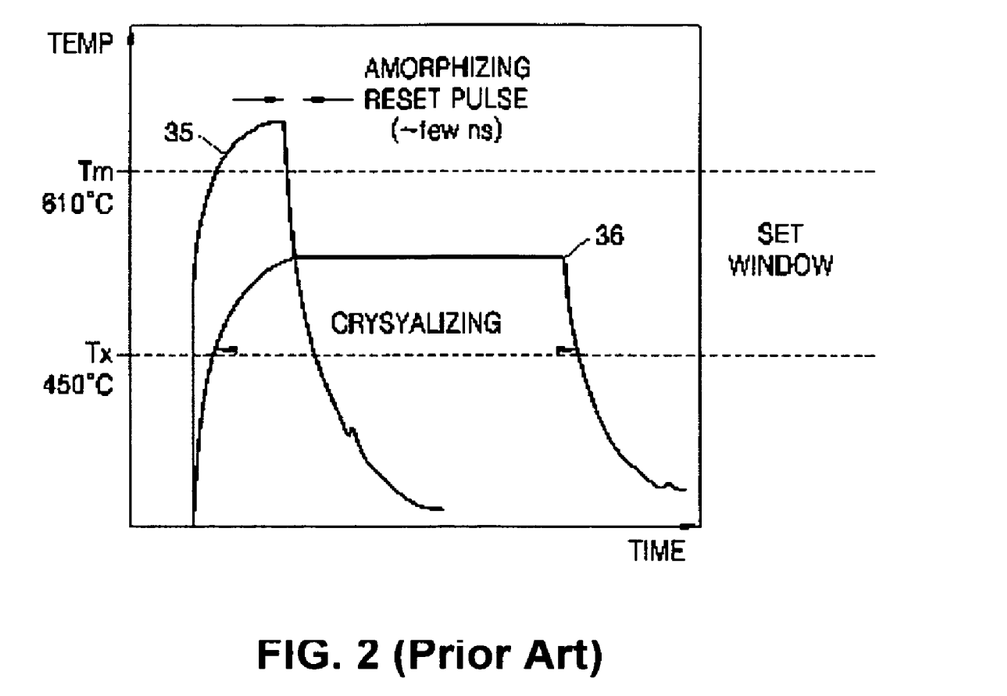
FIG. 2 is a graph showing temperature characteristics during programming of a phase-change memory cell.

FIG. 2 illustrates an example of temperature pulse characteristics of phase-change material as the phase-change material is programmed in the 'set' and 'reset' states. In particular, reference number 35 denotes the temperature pulse of the phase-change material programmed to its 'reset' state, and reference number 36 denotes the temperature pulse of the phase-change material programmed to its 'set' state.

As shown in FIG. 2, when the phase-change material is programmed to its 'reset' state, the temperature of the material is increased above its melting temperature Tm (e.g., 610° C.) for a relatively short period of time, and then allowed to rapidly cool. In contrast, when the phase-change material is programmed to its 'set' state, the temperature of the material is increased to below its melting point Tm and above its crystallizing temperature Tx (e.g., 450° C.) for a longer period of time, and then allowed to cool more slowly. The fast and slow cooling of the 'reset' and 'set' programming operations are referred to in the art as fast "quenching" and slow "quenching", respectively. The temperature range between the melting temperature Tm and the crystallizing temperature Tx is referred to as the "set window".

Figure 3:
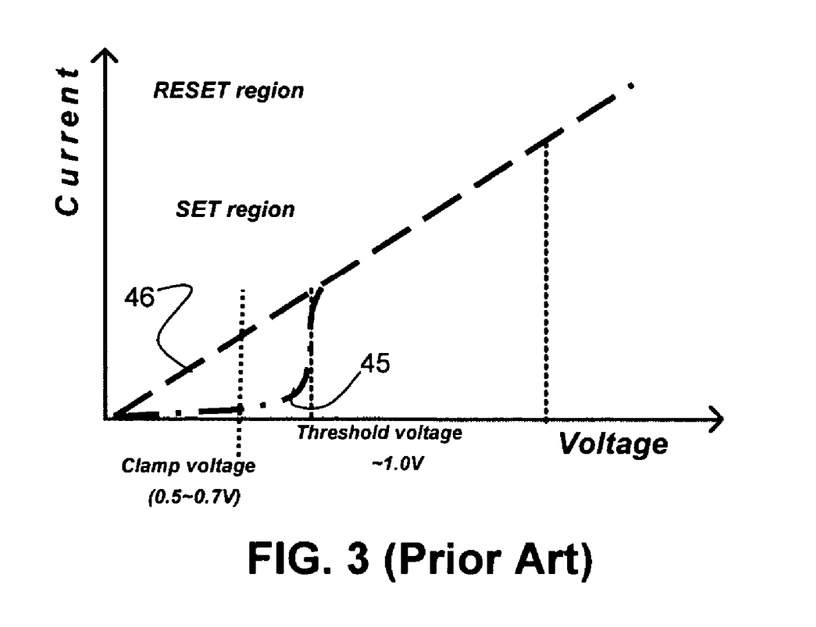
FIG. 3 is graph showing resistive characteristics of a phase-change memory cell.

FIG. 3 is a graph illustrating the resistive characteristic (current versus voltage) of a phase-change material for each of its 'set' and 'reset' states. In particular, line 46 is representative of the resistive characteristic of a phase-change material in its 'set' state, and line 45 is representative of the same in its 'reset' state. As shown, the set and reset resistances differ substantially below a threshold voltage (e.g., 1v), but become substantially equal to one another above the threshold voltage. In order to maintain the necessary sensing margin during reading operations, it is necessary to restrict the bit line BL voltage to a region below the voltage threshold. As explained below with reference to FIG. 4, a clamping transistor inserted in the bit line BL may be used for this purpose.

Figure 4:
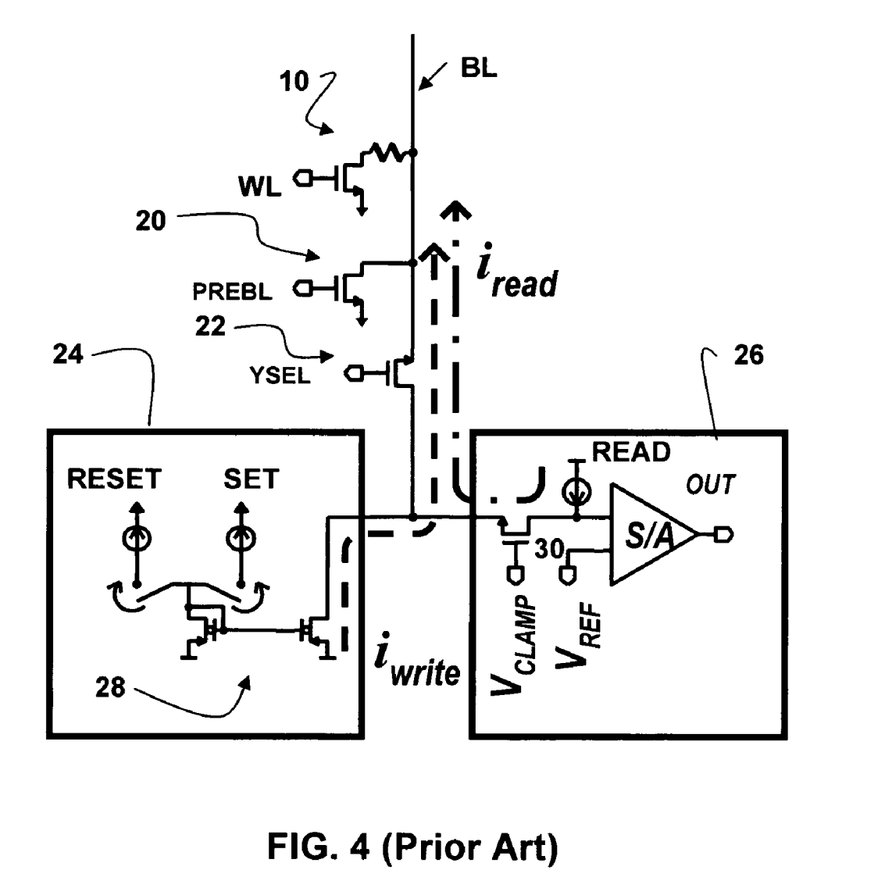
FIG. 4 is a circuit diagram of write and read circuits of a phase-change memory cell.

FIG. 4 is a simplified circuit diagram for explaining write and read operations of the phase-change memory cell. As shown, a bit line BL is coupled to a write driver 24 and a read circuit 26. Also connected to the bit line BL are a phase-change memory cell 10, a pre-charge transistor 20, and a select transistor 22.

In this example, the phase-change memory cell 10 includes a phase-change element and transistor connected in series between the bit line BL and a reference potential (e.g., ground), where the transistor is gated to a word line WL. As suggested previously, other configurations of the phase-change memory cell 10 are possible. For example, the phase-change memory cell 10 may instead include a phase-change memory element and diode connected between the bit line BL and word line WL.

As those skilled in the art will appreciate, the precharge transistor 20 (gated to a precharge control signal PREBL) is used to precharge the bit line BL in a read and/or write operation, while the select transistor 22 (gated to a y-address signal YSEL) is used to activate the bit line BL.

The write driver 24 typically includes a current mirror 28 for applying either a reset current RESET or a set current SET as a write current $i_{write}$ to the bit line BL during a write operation. The reset current RESET and the set current SET were discussed previously in connection with FIG. 2.

The read circuit 26 is functional in a read operation to apply a read current $i_{read}$ from a current source READ to the bit line BL. A clamping transistor 30, which is gated to a clamp control signal $V_{CLAMP}$, restricts the bit line BL voltage to a region below the voltage threshold discussed above in connection with FIG. 3. A sense-amplifier S/A compares the voltage of the bit line BL with a reference voltage $V_{REF}$, and outputs the comparison result as output data OUT.

As with other types of non-volatile memory devices, efforts are being made to reduce the level of the supply voltages utilized to drive phase-change memory devices. However, any reduction in supply voltage levels can adversely impact the sensing margins in the read operation discussed operation.

SUMMARY OF THE INVENTION

According to one aspect of the present invention, a non-volatile semiconductor memory is provided which includes a phase-change memory cell which is selectively connected to a sense node, a boosting circuit which generates a boosted voltage, a pre-charge and biasing circuit which is driven by the boosted voltage to pre-charge and bias the sense node, and a sense amplifier which senses a voltage of the sense node.

According to another aspect of the present invention, a non-volatile semiconductor memory device is provided which includes a phase phase-change memory cell array including a plurality of word lines, a plurality of bit lines, and a plurality of phase-change memory cells, where each the phase-change memory cells includes a phase-change resistive element and a diode connected in series between a word line and a bit line among the plurality of word lines and bit lines of the phase-change memory cell array. The memory device further includes a sense node which is selectively connected to a bit line of the phase-change memory cell array, a boosting circuit which generates a boosted voltage which is greater than an internal power supply voltage, a pre-charge and biasing circuit which is driven by the boosted voltage to pre-charge and bias the sense node, and a sense amplifier connected to the sense node. The boosted voltage is equal to or greater than a sum of the internal power supply voltage and a threshold voltage of the diode of each phase-change memory cell.

According to yet another aspect of the present invention, a method is provided for reading a phase-change memory cell which is selectively coupled to a sense node of a phase-change semiconductor memory device. The method includes generating a boosted voltage which exceeds an internal supply voltage of the phase-change semiconductor memory device, and using the boosted voltage to bias and pre-charge the sense node during a read operation of the phase-change memory cell.

According to still another aspect of the present invention, a system is provided which includes a microprocessor connected to a non-volatile semiconductor memory device. The non-volatile semiconductor memory includes a phase-change memory cell which is selectively connected to a sense node, a boosting circuit which generates a boosted voltage, a pre-charge and biasing circuit which is driven by the boosted voltage to pre-charge and bias the sense node, and a sense amplifier which senses a voltage of the sense node.

BRIEF DESCRIPTION OF THE DRAWINGS

The above and other aspects and features of the invention will become readily apparent from the detailed description that follows, with reference to the accompanying drawings, in which.

DETAILED DESCRIPTION OF PREFERRED EMBODIMENTS

The relatively small sensing margins exhibited by conventional phase-change memory cell devices are discussed in commonly assigned U.S. non-provisional patent application Ser. No. 10/943,300 (published as U.S. publication No. 2005/0030814 A1 on Feb. 10, 2005, and incorporated herein by reference in its entirety). Embodiments of the '300 application, which are directed to enhancing sensing margins of phase-change memory cells devices, are at least partially characterized by supplying a voltage (e.g., a bias voltage) to a sensing node of the read circuits after the supply of a pre-charge voltage to the sense node and during the transfer of charges to the sense node from a phase-change memory cell.

The present invention will now be described by way of exemplary, but non-limiting, embodiments of the invention.

The read circuit of a non-volatile semiconductor memory device according to an exemplary embodiment of the present invention will now be described with reference to FIG. 5 of the drawings.

Figure 5:
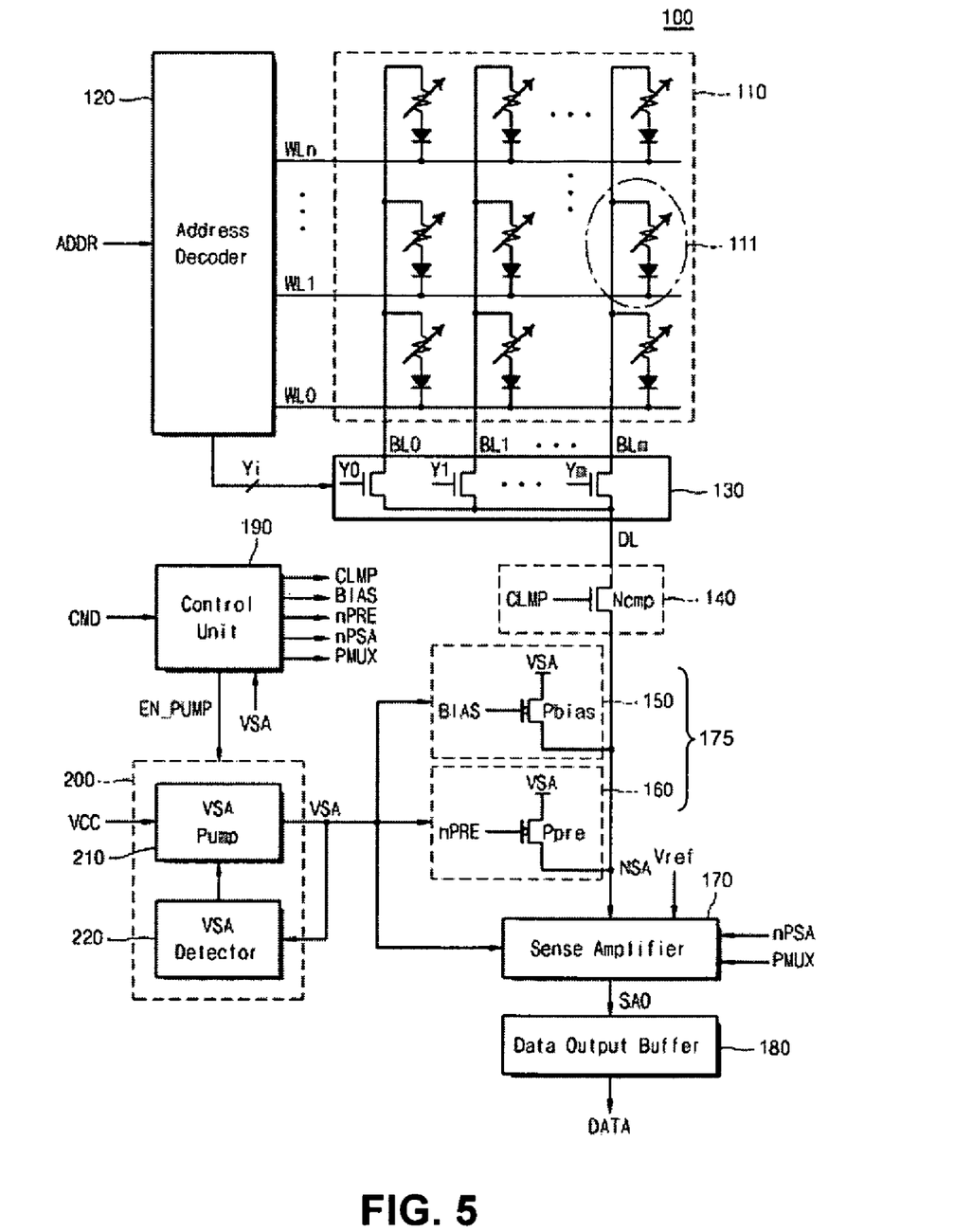
FIG. 5 is a circuit diagram of a phase-change memory cell device according to an embodiment of the present invention.

Referring to FIG. 5, the non-volatile memory device 100 includes a phase-change memory cell array 110 which includes an array of phase-change memory cells 111 connected between intersecting word lines WL<0-n> and bit lines BL<0-m>. In this example, each phase change memory cell 111 includes a phase-change resistive element and a diode element connected between a word line WL and a bit line BL. In FIG. 5, the diode element of each phase-change memory cell 111 is shown connected between a phase-change element and a word line WL. However, the order of these two elements can be reversed. That is, the phase-change element can instead be connected between the diode element and a word line WL of each phase-change memory cell.

It should be noted that the phase-change memory cell array 110 may include other elements not depicted in FIG. 5. As one example only, pre-charge circuits (transistors) may be included to pre-charge the bit lines BL<0-m> in a write operation.

The non-volatile memory device 100 further includes an address decoder 120 and a column selection circuit 130. The address decoder 120 decodes address signals ADDR in order to drive the word lines WL<0-n> and to output a column address signals y<i>, where i equals 0-m. The column address signals y<i> are respectively applied to the gate electrodes of y-gate transistors Y<0-m> of the column selection circuit 130. Each of the Y-gate transistors Y<0-m> is respectively connected between the bit lines BL<0-m> and a data line DL. Those of ordinary skill are well-acquainted with the operation and internal configuration of the address decoder 120 and column selection circuit 130, and accordingly, a detailed description thereof is omitted here.

Still referring to FIG. 5, the non-volatile memory device further includes a clamping circuit 140 connected to the data line DL between the y-gate transistors Y<0-m> and a sense node NSA. As described previously in connection with FIGS. 3 and 4, the clamping circuit 140 functions to clamp the bit line voltage at or below a threshold voltage suitable for reading the phase-change memory cells 111. In the example of this embodiment, the clamping circuit 140 includes an n-type clamping transistor Ncmp connected between the data line DL and the sense node NSA, and gated to a clamping control signal CLMP.

FIG. 5 illustrates the clamping circuit 140 connected to the data line DL between the y-gate transistors Y<0-m> and a sense node NSA. It is noted, however, that other implementations of a clamping circuit or circuit may be possible. For example, a plurality of clamping circuits can be respectively connected in the bit lines BL<0-m> on the other side of the column decoder 130. In this case, the y-gate transistors Y<0-m> would be connected between the clamping circuits and the sense node NSA.

Also connected to the sense node NSA is a sense amplifier 170. The sense amplifier may be driven by a boosted voltage VSA (explained later), and is responsive to control signals nPSA and PMUX to compare a voltage of the sense node NSA with a reference voltage Vref. The comparison result is output from the sense amplifier as an output signal SAO. An exemplary operation and configuration of the sense amplifier 170 will be described later.

The output signal SAO of the sense amplifier 170 is applied to an output buffer 180, which outputs corresponding output data DATA. The operation and internal circuit configuration of the output buffer 180 are well-understood by those of ordinary skill, and accordingly, a detailed description of the output buffer 180 is omitted here.

The non-volatile memory device 100 of the embodiment of FIG. 5 still further includes a pre-charge and biasing circuit 175 connected to the sense node NSA. As will be explained below in connection with FIG. 6, the pre-charge and biasing circuit 175 operates to first pre-charge the sense node 111 in advance of the transfer of charges from a phase-change memory cell 111 to the sense node NSA, and to bias the sense-node NSA when charges are transferred to the sense node NSA to maintain a sufficient sensing margin during a read interval of a read operation.

In this example, the pre-charge and biasing circuit 175 includes a bias circuit 150 and a separate pre-charge circuit 160. The bias circuit 150 of this example includes a p-type transistor Pbias connected between the boosted voltage VSA and the sense node NSA, and gated to receive a bias control signal BIAS. The pre-charge circuit 160 of this example includes a p-type transistor Ppre connected between the boosted voltage VSA and the sense node NSA, and gated to receive a pre-charge control signal nPRE.

A voltage level of the boosted voltage VSA is greater than an internal supply voltage (typically referred to as supply voltage "VCC") of the non-volatile semiconductor memory device. The voltage level of the boosted voltage VSA may optionally be the same as what is commonly referred to in the art as a boosted voltage "VPP".

Herein, the internal supply voltage VCC is preferably 1.2V or less, and more preferably 1.0V or less.

As shown in FIG. 5, the boosted voltage VSA is generated by a boosted voltage generator 200. In this example, the boosted voltage generator 200 is enabled by a pump enable signal EN_PUMP and includes a VSA charge pump 210 and a VSA voltage detector 220. The VSA charge pump 210 functions in a well-known manner to convert the internal supply voltage VCC to the boosted voltage VSA under feedback control of the VSA voltage detector 220.

The aforementioned control signals EN_PUMP, CLMP, BIAS, nPRE, nPSA, and PMUX are generated by the control unit 190 shown in FIG. 5. In particular, the control unit 190 is configured to generate pre-defined control signals in response to externally received commands CMD. The internal circuitry of the control unit 190 can be configured any number of different ways as will be readily understood by those of ordinary skill. Thus, and for the sake of brevity, a detailed hardware description of the control unit 190 is omitted here.

An operational example of the non-volatile semiconductor memory device of FIG. 5 will now be explained with reference to the timing diagram of FIG. 6. Here, by way of example, the reading of the phase-change memory cell 111 connected between word line WL1 and bit line BLm of FIG. 5 will be described. It is assumed that the threshold voltage of the diode of the phase-change memory element is about 1V.

Figure 6:
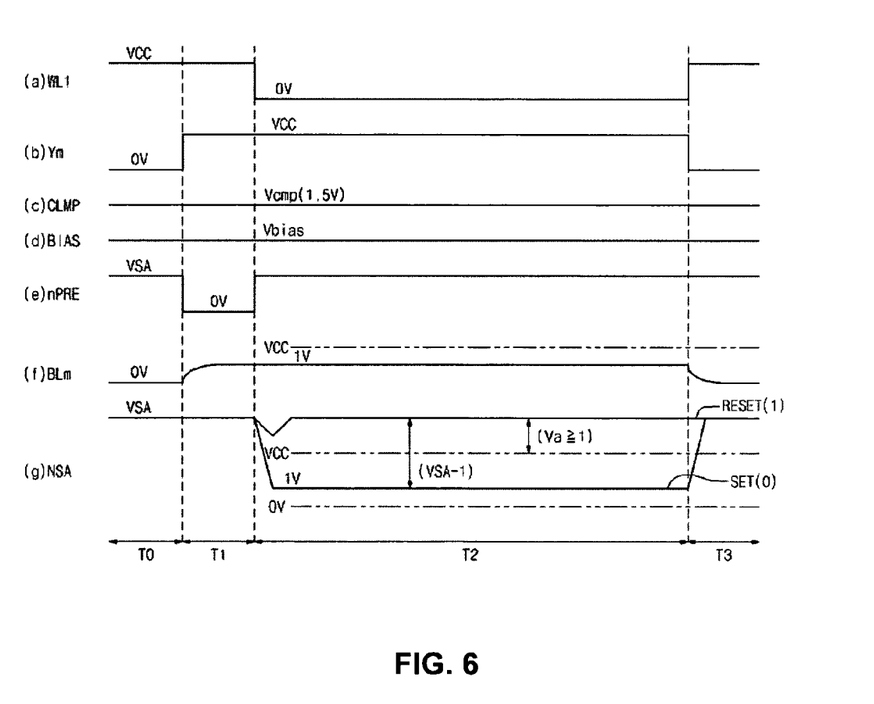
FIG. 6 is a timing diagram for use in explaining the operation of the phase-change memory cell device of FIG. 5.

Referring collectively to FIGS. 5 and 6, during an initial standby interval T0, the voltage of the word line WL1 is HIGH (e.g., the internal supply voltage VCC), and the diode of the phase-change memory cell 111 is therefore effectively in an "off" state. Also during the standby interval T0, the column address signal Ym is LOW (e.g., ground), the clamp voltage CLMP is Vcmp (e.g., about 1.5V), the bias voltage BIAS is Vbias, and the precharge voltage NPRE is the boosted voltage VSA. In this state, the voltage of the bit line BLm is 0V, and the voltage of the sense node NSA is the boosted voltage VSA.

Next, at an interval T1, the bit line is activated by driving the column address signal Ym to HIGH (e.g., VCC), and the voltage of the bit line BL starts to rise to a level of about Vcmp minus the threshold voltage of the transistor Ncmp, i.e., to about 1V. In addition, the precharge transistor Ppre is activated by driving the precharge signal nPRE to ground.

Next, during interval T2, the word line WL1 is driven LOW, and the precharge transistor Ppre is deactivated. In the case where the phase-change memory cell 111 is in a SET (0) state, the sensing node NSA will drop to a voltage of about 1V (i.e., the threshold voltage of the diode). On the other hand, in the case where the phase-change cell 111 is in a RESET (1) state, the sensing node NSA will essentially maintained at a voltage of the boosted voltage VSA supplied by bias transistor Pbias.

As is apparent from FIG. 6, the sensing margin of the phase-change memory device is about equal to the difference between the boosted voltage VSA and the threshold voltage of the phase change memory cell 111, i.e., the threshold voltage of the diode of the phase change memory element 111.

In contrast to the present embodiment, assume that the pre-charge and biasing circuit 175 is driven by the supply voltage VCC instead of the boosted voltage VSA. Assume further that VCC is about 1.5V, and again that the threshold voltage of the diode is about 1V. In this case, this sensing margin is only about 0.5V (i.e., 1.5V–1V). If the supply voltage VCC is reduced to 1.2V, the sensing margin drops substantially to 0.2V.

In contrast, according to embodiments of the present invention, the pre-charge and biasing circuit 175 is driven by the boosted voltage VSA. Preferably, the boosted voltage VSA is equal to or greater than the sum of the supply voltage VCC and the threshold voltage of the diode. Assume again that VCC is about 1.5V, and the diode threshold is about 1V. If the boosted voltage VSA is about 2.5V, then the sensing margin is substantially improved to 1.5V. Further, even if the VCC is dropped to 1.2V, a sensing margin of 1.3V or more can be realized.

An example of the sense amplifier 170 according to an embodiment of the present invention will now be described with reference to FIG. 9 of the drawings.

Figure 9:
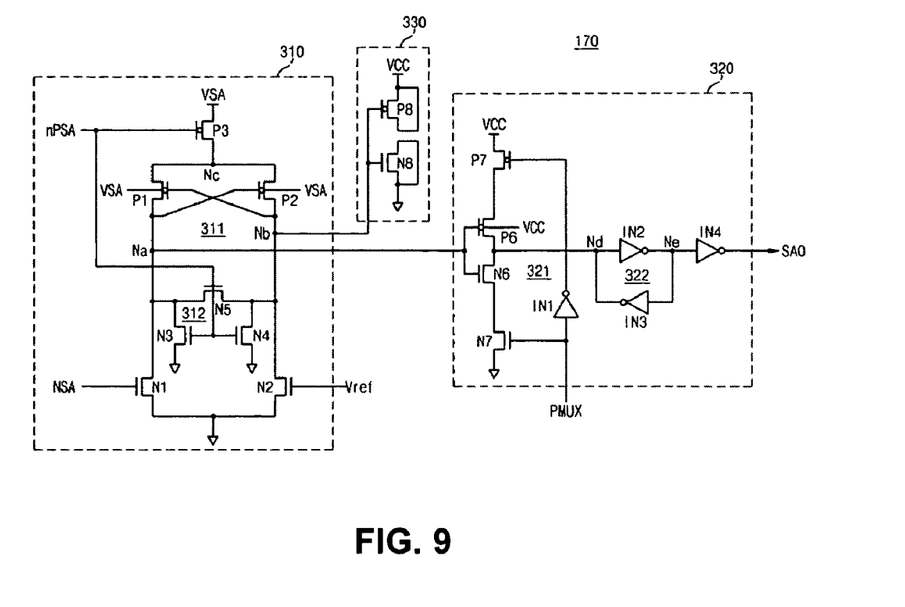
FIG. 9 is a circuit diagram of a sense amplifier according to an embodiment of the present invention.

The sense amplifier 170 of FIG. 9 includes a sensing portion 310, a latch portion 320, and a dummy latch portion 330. Preferably, at least the sensing portion 310 of the sense amplifier 170 is driven by the boosted voltage VSA.

The sensing portion 310 includes a sensing circuit 311 and an equalizer circuit 312. The sensing portion 310 of this example includes p-type transistors P1 through P3 and n-type transistor N1 through N5 all connected as shown in FIG. 5 between the boosted voltage VSA and ground. The sensing node NSA is connected to the gate of transistor N1, and the read threshold voltage Vref is connected to the gate of transistor N2. In the meantime, the equalizer circuit is connected across the sensing circuit nodes Na and Nb as shown, and the control signal NPSA is applied to the gates of transistors P3, N3, N4 and N5.

The latch portion 320 of this example includes an inverter circuit 321 and a latch circuit 322. As shown in FIG. 9, the inverter circuit 321 is connected to sensing circuit node Na of the sensing portion 310, and includes p-type transistors P6 and P7, n-type transistors N6 and N7, and inverter IN1. The latch circuit 322 includes inverters IN2 through IN4. In this example, the latch portion 320 is driven by the internal power supply voltage VCC. Also, in the inverter circuit 321, the control signal PMUX is applied to the input of the inverter IN1 and to the gate of transistor N7.

The dummy latch portion 330 of this example is driven by VCC and includes an n-type transistor N8 and a p-type transistor P8, each having gates connected to the sensing circuit node Nb. As will be appreciated by those skilled in the art, the dummy latch portion 330 is provided to match the load of the latch portion 320 across the sensing portion 310.

The operation of the sensing amplifier 170 shown in FIG. 9 will now be described with reference to the timing diagram of FIG. 10.

Figure 10:
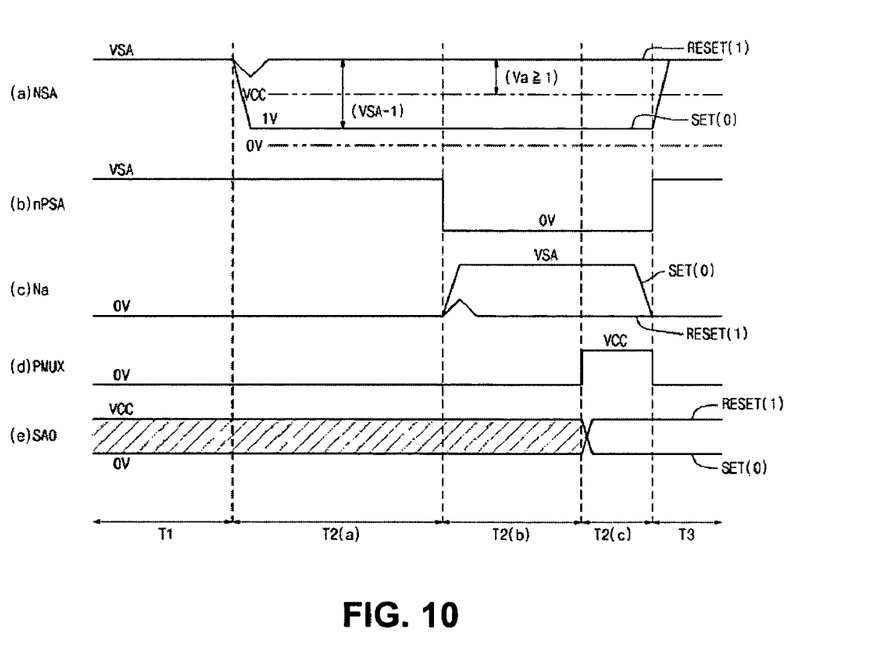
FIG. 10 is a timing diagram for use in explaining the operation of the sense amplifier of FIG. 9.

Referring collectively to FIGS. 9 and 10, during time interval T1, the voltage of control signal nPSA is the boosted voltage VSA. Accordingly, the sensing circuit 311 is disabled, and the equalizing circuit 312 is enabled to bring the sensing circuit nodes Na and Nb to ground (0v). Further, the control signal PMUX is low (0v), thus disabling the inverter circuit 321. The output SAO from the latch circuit 322 thus remains unchanged.

Next, at time interval T2(a), the voltage of the sense node NSA either remains at VSA or drops to about 1V, depending on whether the read memory cell is in its 'reset' or 'set' state. This operation was described previously in connection with FIG. 6.

Next, at time interval T2(b), the voltage of control signal nPSA goes to 0v, thus enabling the sensing circuit 311 and disabling the equalizing circuit 312. The sensing circuit node Na goes to VSA in the case of the 'set' state where the sense node NSA voltage (about 1v) is less than the reference voltage Vref, and the sensing circuit node Na goes to 0v in the case of the 'reset' state where the NSA voltage (VSA) is greater than the reference voltage Vref.

Then, at interval T2(c), the control signal PMUX is brought to VCC, thus enabling the inverter circuit 321. The inverter circuit 321 inverts either the voltage VSA (high) or 0v (low) of the internal sensing circuit node Na, and drives the latch circuit 322 accordingly to either flip or maintain the output data SAO.

Finally, at time interval T3, the voltage of nPSA is returned to the boosted voltage VSA to disable the sensing circuit 311 and enable the equalizing circuit 312, and the control signal PMUX is return to low (0v), thus disabling the inverter circuit 321.

Figure 7:
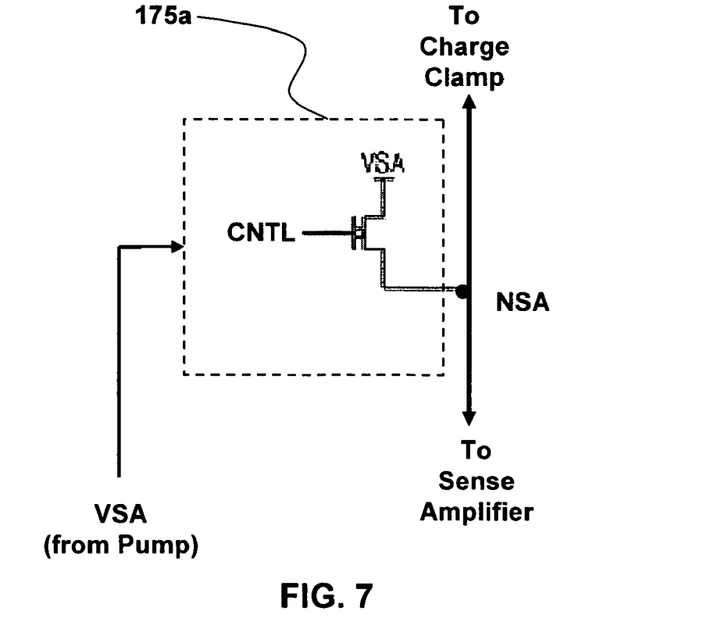
FIG. 7 is a circuit diagram of a pre-charge and biasing circuit according to an embodiment of the present invention.

The pre-charge and biasing circuit 175 of FIG. 5 is composed of separate pre-charge and biasing transistors Ppre and Pbias, respectively. However, the invention is not limited in this manner. For example, as illustrated in FIG. 7, a single transistor 175a driven by the boosted voltage VSA can be utilized to both pre-charge and bias the sense node NSA. In this case, a control signal CNTL is supplied to realize the pre-charging and biasing functions discussed previously in connection with FIG. 6.

Figure 8:
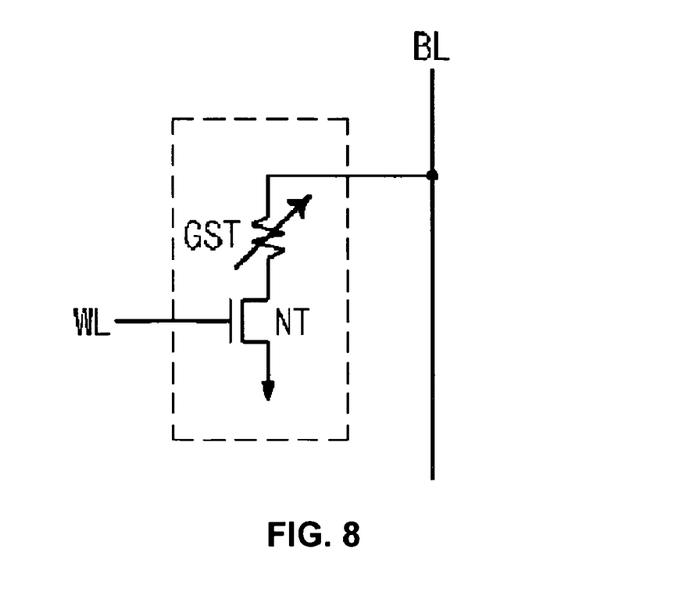
FIG. 8 is a circuit diagram of a phase-change memory cell which may be used in embodiments of the present invention.
Figure 11:
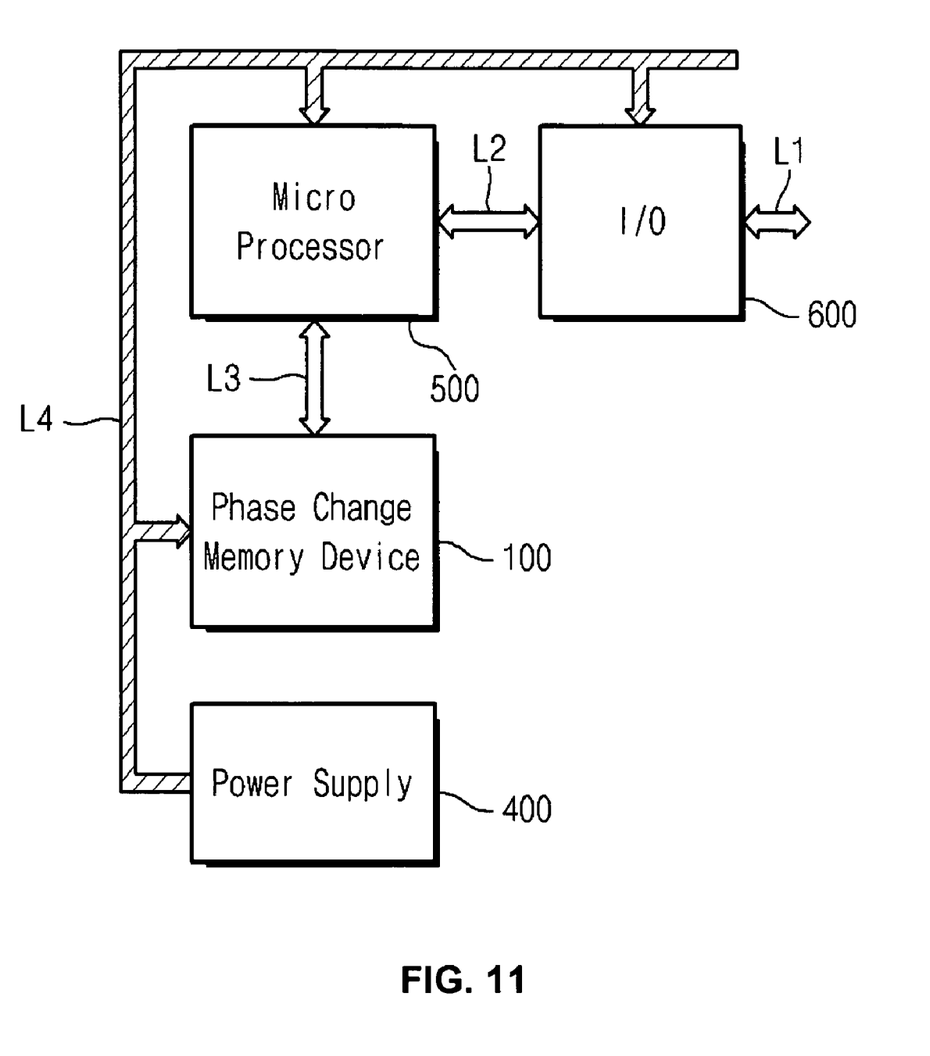
FIG. 11 is a block diagram of a system containing a phase-change memory cell device according to embodiments of the present invention.

Also, the invention is not limited to phase-change memory cells having access diodes. For example, as shown in FIG. 7, each phase-change memory cell may instead include a phase-change memory element GST connected in series with an access transistor NT that is gated to a word line WL. In this case, an oxide thickness of the MOS transistor or transistors of the pre-charge and biasing circuit 175 (or 175a) is preferably greater than an oxide thickness of the MOS transistor NT of the phase-change memory cell. Likewise, a threshold voltage of the MOS transistor or transistors of the pre-charge and biasing circuit 175 (or 175a) is preferably greater than a threshold voltage of the MOS transistor NT of the phase-change memory cell The phase-change memory devices of the present invention may be utilized, for example, as the non-volatile memory of multiple types of microprocessor driven appliances. FIG. 11 is a simplified block diagram of a system containing a phase-change memory device 100 of the present invention. The phase-change memory 100 can function as random access memory of the system, or as a mass storage device of the system, or both. As illustrated, the phase change memory device 100 is connected to a microprocessor 500 via one or more data buses L3. The microprocessor 500 exchanges data over one or more data buses L2 with an I/O interface 600, and the I/O interface 600 transmits and receives data over input/output data lines L1. As examples, the input/output data lines L1 may be operatively coupled to a computer peripheral bus, a high speed digital communication transmission line, or an antenna system. A power distribution system L4 supplies power from a power supply 400 to the phase-change memory device 100, the microprocessor 500 and the I/O interface 600.

The system of FIG. 11 may be utilized in both portable and non-portable appliances. In the case of portable appliances, the power supply 400 will typical contain one or more battery cells. Phase-change memory devices, such as PRAM devices, are particularly suited to battery-powered applications in view of their non-volatile memory characteristics. Non-limiting examples of portable appliances include notebook computers, digital cameras, a personal digital assistants (PDA's), and mobile communication devices, such as mobile telephones, mobile email devices, and mobile gaming devices. Non-limiting examples of non-portable appliances include desk-top computers, network servers, and other computing devices typically driven by fixed commercial or residential power systems (such as AC power systems).

Although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. A non-volatile semiconductor memory, comprising:
a phase-change memory cell which is programmable at least between a set state and a reset state and which includes a selection element to selectively connect the phase-change memory cell to a sense node;
a boosting circuit which receives an internal supply voltage and generates a boosted voltage having a voltage level which is greater than a voltage level of the internal supply voltage;
a pre-charge circuit which is driven by the boosted voltage to pre-charge the sense node so that the voltage of the sense node is the boosted voltage before a sensing interval;
a biasing circuit which is driven by the boosted voltage to bias the sense node; and
a sense amplifier which senses a voltage of the sense node during the sensing interval, wherein the sense amplifier includes a power supply terminal driven by the boosted voltage and an input terminal connected to the sense node,
wherein, during the sensing interval, a sensing margin at the sense node between the set state and the reset state is defined by a difference between the boosted voltage and a voltage across the selection element of the phase-change memory cell.

2. The non-volatile semiconductor memory of claim 1, wherein the pre-charge and biasing circuit comprises a first transistor connected between the boosted voltage and the sense node which pre-charges the sense node, and a second transistor connected between the boosted voltage and the sense node which biases the sense node.

3. The non-volatile semiconductor memory of claim 2, wherein the first and second transistors are MOS transistors.

4. The non-volatile semiconductor memory of claim 1, wherein the pre-charge and biasing circuit comprises a transistor which both pre-charges and biases the sense node.

5. The non-volatile semiconductor memory of claim 4, wherein the transistor is an MOS transistor.

6. The non-volatile semiconductor memory of claim 1, wherein the selection element is an MOS transistor, and wherein the phase-change memory cell comprises a phase-change resistive element and the MOS transistor connected in series between a bit line and a reference voltage, wherein a gate of the MOS transistor is connected to a word line, and wherein the bit line is selectively connected to the sense node.

7. The non-volatile semiconductor memory of claim 6, wherein the MOS transistor is connected between the reference voltage and the phase-change element.

8. The non-volatile semiconductor memory of claim 6, wherein the phase-change element is connected between the reference voltage and the MOS transistor.

9. The non-volatile semiconductor memory of claim 6, wherein the pre-charge and biasing circuit includes at least one MOS transistor connected between the boosted voltage and the sense node, and wherein an oxide thickness of the MOS transistor of the phase-change memory cell is less than an oxide thickness of the at least one MOS transistor of the pre-charge and biasing circuit.

10. The non-volatile semiconductor memory of claim 6, wherein the pre-charge and biasing circuit includes at least one MOS transistor connected between the boosted voltage and the sense node, and wherein a threshold voltage of the MOS transistor of the phase-change memory cell is less than a threshold voltage of the at least one MOS transistor of the pre-charge and biasing circuit.

11. The non-volatile semiconductor memory of claim 1, wherein the selection element is a diode and the voltage across the selection element is a threshold voltage of the diode, and wherein the phase-change memory cell comprises a phase-change resistive element and the diode connected in series between a bit line and a word line, and wherein the bit line is selectively connected to the sense node.

12. The non-volatile semiconductor memory of claim 11, wherein the diode is connected between the word line and the phase-change element.

13. The non-volatile semiconductor memory of claim 11, wherein the phase-change element is connected between the word line and the diode.

14. The non-volatile semiconductor memory of claim 11, further comprising a clamping circuit connected between the phase-change memory cell and the sense node.

15. The non-volatile semiconductor memory of claim 14, further comprising a selection circuit which selectively connects the phase-change memory cell to the clamping circuit.

16. The non-volatile semiconductor memory of claim 15, wherein the selection circuit is connected between clamping circuit and cell.

17. The non-volatile semiconductor memory of claim 1, wherein the sense amplifier comprises a sensing unit connected to the sense node, and a latch unit connected to the sensing unit.

18. The non-volatile semiconductor memory of claim 17, wherein the sensing unit comprises an equalizing circuit.

19. The non-volatile semiconductor memory of claim 17, wherein the sensing unit is driven by the boosted voltage, and the latch unit is driven by the internal supply voltage.

20. The non-volatile semiconductor memory of claim 17, wherein the sense amplifier further comprises a dummy latch unit connected to the sensing unit.

21. The non-volatile semiconductor memory of claim 1, wherein a phase-change material of the phase-change memory cells comprises Ge and Sb.

22. The non-volatile semiconductor memory of claim 21, wherein the phase-change material further comprises Te.

23. The non-volatile semiconductor memory of claim 1, further comprising a control circuit operative in a read mode to (a) control the bias circuit to bias the sense node during a read interval, (b) control the pre-charge circuit to pre-charge the sense node during a first part of the read interval, and (c) control the sense amplifier to sense a voltage of the sense node during a second part of the read interval.

24. A non-volatile semiconductor memory device, comprising:
- a phase-change memory cell array comprising a plurality of word lines, a plurality of bit lines, and a plurality of phase-change memory cells, wherein each the phase-change memory cells is programmable at least between a set state and a reset state and comprises a phase-change resistive element and a diode connected in series between a word line and a bit line among the plurality of word lines and bit lines of the phase-change memory cell array;
- a sense node which is selectively connected to a bit line of the phase-change memory cell array;
- a boosting circuit which generates a boosted voltage which is greater than an internal power supply voltage;
- a pre-charge circuit which is driven by the boosted voltage to pre-charge the sense node so that the voltage of the sense node is the boosted voltage before a sensing interval;
- a biasing circuit which is driven by the boosted voltage to bias the sense node; and
- a sense amplifier which includes a power supply terminal driven by the boosted voltage and an input terminal connected to the sense node, wherein the sense amplifier is configured to sense a voltage of the sense node during a sensing interval;
- wherein the boosted voltage is equal to or greater than a sum of the internal power supply voltage and a threshold voltage of the diode of each phase-change memory cell, and
- wherein, during the sensing interval, a sensing margin at the sense node between the set state and the reset state is defined by a difference between the boosted voltage and a threshold voltage of the diode of each phase-change memory cell.

25. The non-volatile semiconductor memory device of claim 24, wherein the internal power supply voltage is 1.2 volts or less.

26. The non-volatile semiconductor memory device of claim 24, wherein the internal power supply voltage is 1.0 volts or less.

27. A method of reading a phase-change memory cell which is programmable at least between a set state and a reset state and which is selectively coupled to a sense node of a phase-change semiconductor memory device, the method comprising generating a boosted voltage which exceeds an internal supply voltage of the phase-change semiconductor memory device, precharging the sense node as the boosted voltage before a sensing interval, using a selection element to connect the phase change memory cell to the sense node, and sensing a voltage of the sense node during the sensing interval,
- wherein, during the sensing interval, a sensing margin at the sense node between the set state and the reset state is defined by a difference between the boosted voltage and a voltage across the selection element of the phase-change memory cell.

28. The method of claim 27, wherein the selection element is a diode and the voltage across the selection element is a threshold voltage of the diode, and wherein the phase-change memory cell includes the diode and a phase-change element, and wherein boosted voltage equals or is greater than the internal power supply voltage plus a threshold voltage of the diode.

29. The method of claim 28, wherein the internal supply voltage is equal to or less than 1.2V.

30. The method of claim 28, wherein the internal supply voltage is equal to or less than 1.0V.

31. A system comprising a microprocessor connected to a non-volatile semiconductor memory device, the non-volatile semiconductor memory comprising a phase-change memory cell which is programmable at least between a set state and a reset state and which includes a selection element to selectively connect the phase-change memory cell to a sense node, a boosting circuit which generates a boosted voltage, a pre-charge and biasing circuit which is driven by the boosted voltage to pre-charge the sense node so that the voltage of the sense node is the boosted voltage before a sensing interval and bias to the sense node, and a sense amplifier which senses a voltage of the sense node during the sensing interval, wherein a power supply terminal of the sense amplifier is driven by the boosted voltage, and
- wherein, during the sensing interval, a sensing margin at the sense node between the set state and the reset state is defined by a difference between the boosted voltage and a voltage across the selection element of the phase-change memory cell.

32. The system of claim 31, further comprising an input/output interface connected to the microprocessor, and a power supply which supplies power to the microprocessor, the non-volatile semiconductor memory device, and the input/output interface.

33. The system of claim 32, wherein the system is installed in a mobile communication device.

34. The system of claim 31, wherein the selection element is a diode and the voltage across the selection element is a threshold voltage of the diode, and wherein the phase-change memory cell includes the diode and a phase-change element, and wherein the boosted voltage equals or is greater than an internal power supply voltage of the non-volatile semiconductor memory device plus a threshold voltage of the diode.

35. The system of claim 34, wherein the internal supply voltage is equal to or less than 1.2V.

36. The method of claim 34, wherein the internal supply voltage is equal to or less than 1.0V.

* * * * *